United States Patent
Abbasfar et al.

(10) Patent No.: US 8,581,755 B2
(45) Date of Patent: Nov. 12, 2013

(54) MULTIPLE WORD DATA BUS INVERSION

(75) Inventors: Aliazam Abbasfar, Sunnyvale, CA (US); John Wilson, Raleigh, NC (US)

(73) Assignee: Rambus Inc., Sunnyvale, CA (US)

(*) Notice: Subject to any disclaimer, the term of this patent is extended or adjusted under 35 U.S.C. 154(b) by 0 days.

(21) Appl. No.: 13/502,474

(22) PCT Filed: Oct. 8, 2010

(86) PCT No.: PCT/US2010/052094
§ 371 (c)(1),
(2), (4) Date: Apr. 17, 2012

(87) PCT Pub. No.: WO2011/090523
PCT Pub. Date: Jul. 28, 2011

(65) Prior Publication Data
US 2012/0206280 A1 Aug. 16, 2012

Related U.S. Application Data

(60) Provisional application No. 61/296,758, filed on Jan. 20, 2010.

(51) Int. Cl.
*H03M 5/00* (2006.01)

(52) U.S. Cl.
USPC ............ 341/58; 714/777; 714/809; 341/59; 341/70; 710/100; 710/52; 710/124; 710/305; 380/268; 365/184; 365/189.05; 365/154; 365/198; 365/200; 708/490

(58) Field of Classification Search
USPC .......... 714/777.809; 341/55–95; 380/268, 28; 365/184, 189.05, 154, 198, 200, 63, 365/207, 201; 708/490
See application file for complete search history.

(56) References Cited

U.S. PATENT DOCUMENTS

| | | | |
|---|---|---|---|
| 6,584,526 B1 * | 6/2003 | Bogin et al. | 710/124 |
| 6,844,833 B2 | 1/2005 | Cornelius et al. | 341/58 |
| 6,898,648 B2 * | 5/2005 | LaBerge | 710/100 |
| 7,082,489 B2 * | 7/2006 | Yeh et al. | 710/305 |
| 7,149,955 B1 | 12/2006 | Sutardja et al. | 714/809 |

(Continued)

FOREIGN PATENT DOCUMENTS

KR  10-2007-0099373 A  10/2007

OTHER PUBLICATIONS

PCT International Search Report and Written Opinion, PCT/US2010/052094, May 13, 2011, 8 Pages.

(Continued)

*Primary Examiner* — Lam T Mai
(74) *Attorney, Agent, or Firm* — Fenwick & West LLP

(57) ABSTRACT

A data encoding scheme for transmission of data from one circuit to another circuit considers the Hamming Weight of combined multiple words to determine whether to invert or not invert an individual word to be transmitted. The multi-word data encoding scheme performs DBI encoding with data inversion conducted based on the total HW in the combined multiple words. The decision to invert or not invert each of the multiple words is made based on the sum of the individual Hamming Weights of each of the words. Such encoding has the advantage that SSO noise is dramatically reduced when the encoded data has a large number of words transmitted from one circuit to another circuit over a wide parallel bus.

21 Claims, 9 Drawing Sheets

(56) References Cited

U.S. PATENT DOCUMENTS

| | | | |
|---|---|---|---|
| 7,260,223 B2 | 8/2007 | Inoue et al. | |
| 7,400,541 B2* | 7/2008 | Jang et al. | 365/189.07 |
| 7,471,219 B1 | 12/2008 | Lastras-Montano | 341/83 |
| 7,495,587 B2* | 2/2009 | Bae | 341/55 |
| 7,501,963 B1 | 3/2009 | Hollis | 341/55 |
| 7,506,146 B2 | 3/2009 | Joshi | 713/1 |
| 7,522,073 B1 | 4/2009 | Kao | 341/55 |
| 7,616,133 B2* | 11/2009 | Hollis | 341/58 |
| 7,853,013 B2* | 12/2010 | Vasyltsov et al. | 380/28 |
| 7,899,961 B2* | 3/2011 | Kao | 710/100 |
| 8,094,045 B2* | 1/2012 | Hollis | 341/58 |
| 2007/0242508 A1 | 10/2007 | Bae | |
| 2009/0182918 A1 | 7/2009 | Hollis | |
| 2009/0193319 A1 | 7/2009 | Shen et al. | |
| 2011/0084737 A1* | 4/2011 | Oh et al. | 327/108 |
| 2011/0127990 A1* | 6/2011 | Wilson et al. | 324/76.44 |
| 2012/0131244 A1* | 5/2012 | Abbasfar | 710/105 |

OTHER PUBLICATIONS

Bae, Seung-Jun, et al., "An 80nm 4 Gb/s/pin 32 bit 512 Mb GDDR4 Graphics DRAM with Low Power and Low Noise Data Bus Inversion", IEEE Journal of Solid-State Circuits, vol. 43, No. 1, Jan. 2008. 11 Pages.

* cited by examiner

MULTIPLE WORD DATA BUS INVERSION

BACKGROUND

The present disclosure relates to encoding data for transfer on a chip to chip communication link.

Integrated circuit devices communicate with one another using input/output (I/O) circuits that are configured to transmit and receive multi-bit data over a plurality of signal lines. When multiple output drivers on the circuits change state at the same time at a high speed to transmit the multi-bit data, the changing current drawn by the output drivers from a power supply induces a voltage that results in power supply disturbance, commonly referred to as simultaneous switching output ("SSO") noise (or simultaneous switching noise ("SSN")). SSN can cause undesired transient behavior among the output drivers, input receivers or internal logic on the circuits.

Techniques used for reducing SSN on parallel links include data bus inversion (DBI), also referred to as dynamic bus inversion. DBI inverts some or all of the multi-bit data to be transferred based on certain criteria relating to the logic state of the bits in the multi-bit data to be transmitted over the parallel communication link to reduce SSN by decreasing the number of transmitter switching transitions that occur across the communication link. For example, conventional DBI techniques may invert the logic states of the bits of an 8-bit word from "0" to "1" or from "1" to "0" if the 8-bit word has Hamming Weight ("HW") exceeding four, such that the DBI-encoded word has HW not greater than four and thereby limiting the number of transmitter switching transitions. A DBI bit is added to the encoded data to indicate whether or not the data was inverted, with DBI=1 typically indicating that the encoded data is an inversion of the original un-encoded data and DBI=0 indicating that the encoded data is identical to the original un-encoded data (no inversion occurred). Hamming Weight as used herein refers to the number of non-zero (i.e., logic level "1") bits in n-bit digital data $D_n$, although HW may also be defined to refer to the number of zero (i.e., logic level "0") bits in the n-bit data $D_n$. Both definitions of HW are within the scope of the present disclosure. With conventional DBI, SSN may be reduced by 50% per word compared to the SSN in the un-encoded data.

Conventional DBI is carried out on a per-word basis, where a word is a set of data bits, which can be 1 byte (e.g., 8 bits), 2 bytes (e.g., 16 bits), etc. That is, the decision to invert or not invert the data bits of a word depends solely on the logic states or the HW of that particular word. As a result, when multiple words of data are transmitted over a parallel communication link with conventional DBI encoding, the HW of the multiple words in combination may be high, even though the HW of each word is low due to the DBI encoding. This becomes problematic when the communication link is a wide parallel bus for transmitting multiple words of data.

DETAILED DESCRIPTION OF EMBODIMENTS

Embodiments of the present disclosure include a multi-word data encoding scheme for transmission of multi-word data from one circuit to another circuit. According to the multi-word data encoding scheme, DBI encoding is performed with data inversion conducted based on the total HW in the combined multiple words. The decision to invert or not invert each of the multiple words is made based on the sum of the Hamming Weights of the individual words.

As a result, the total HW of the DBI-encoded multiple words is limited to a predetermined range that reduces SSO noise. In one embodiment, the range of HW variation in the multiple words encoded according to the DBI encoding scheme herein is smaller than the sum of the HWs of the individual words if they were encoded using conventional DBI encoding. In another embodiment, the range of HW variation of the multiple words encoded according to the DBI encoding scheme herein is smaller than the sum of the range of HW variation for each individual word.

Reference will now be made to several embodiments of the present disclosure, examples of which are illustrated in the accompanying figures. It is noted that wherever practicable similar or like reference numbers may be used in the figures and may indicate similar or like functionality. The figures depict embodiments of the present disclosure for purposes of illustration only. One skilled in the art will readily recognize from the following description that alternative embodiments of the structures and methods illustrated herein may be employed without departing from the principles of the disclosure described herein.

Figure 1:
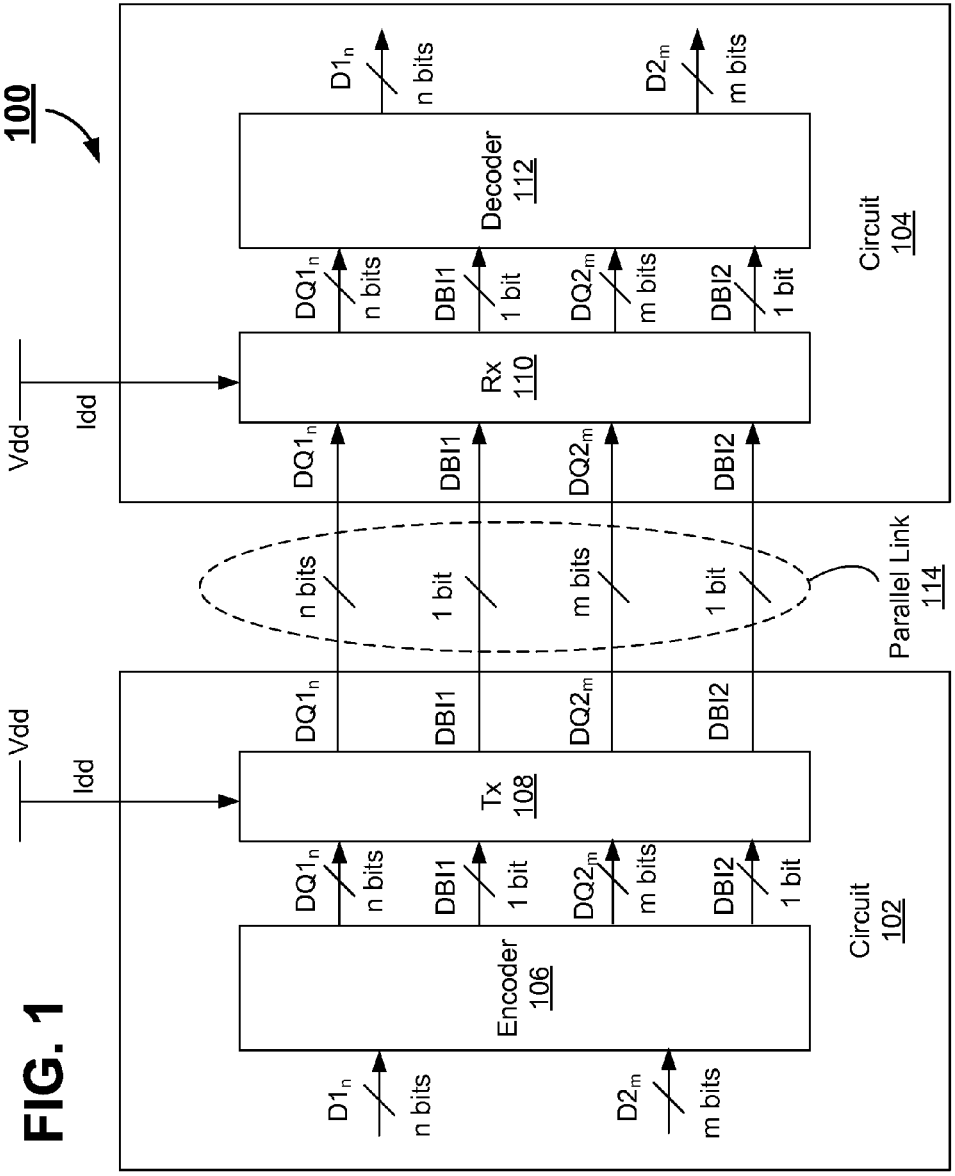
FIG. 1 illustrates a system including an encoder and a decoder using multi-word DBI, according to one embodiment.

FIG. 1 illustrates a system including an encoder and decoder using multi-word DBI, according to one embodiment. The system of FIG. 1 includes two circuits 102, 104 configured to communicate with each other on a parallel communication link 114. For example, circuit 102 may be a memory controller, and circuit 104 may be a memory device such as a DRAM or SRAM, or vice versa. Circuits 102, 104 may also be other types of circuits communicating data between each other. Although the link 114 is shown herein as a single-ended parallel communication link, link 114 can also be a link configured to transmit differential signals.

The parallel communication link 114 may be a bus or part of a bus on a circuit board on which the circuits 102, 104 reside, and may include a first group of n parallel transmission lines (or pairs of transmission lines) for transmitting a first sequence of n-bit code words $DQ1_n$ and a second group of m parallel transmission lines (or pairs of transmission lines) for transmitting a second sequence of m-bit code words $DQ2_m$, from circuit 102 to circuit 104, and/or vice versa. Here n and m can be the same or different numbers. Link 114 further includes a first DBI transmission line (or a pair of DBI transmission lines) for transmitting a first sequence of DBI bits DBI1 associated with respective ones of the sequence of n-bit code words $DQ1_n$ and a second DBI transmission line (or a pair of DBI transmission lines) for transmitting a second sequence of DBI bits DBI2 associated with respective ones of the sequence of m-bit code words $DQ2_m$. Thus, link 114 can have a data width (e.g., n+m+2 bits) larger than the number of bits (e.g., n+m bits) of the code words $DQ1_n$ and $DQ2_m$ to be transmitted from circuit 102 to circuit 104, and/or vice versa. In one example, each of $DQ1_n$ and $DQ2_m$ may be 8-bit coded data, together forming 16 bits of coded data in total. Each n-bit code word $DQ1_n$ or m-bit code word $DQ2_m$ has a Hamming Weight (HW) depending upon the number of logic level "1"s in each code word. The Hamming Weight of a set of bits of data (e.g., one or more data words) or coded data (e.g., one or more code words) herein refers to the number of non-zero (i.e., logic level "1") bits in the set of bits of data or coded data.

In one embodiment, each n-bit code word $DQ1_n$ and the m-bit code word $DQ2_m$ correspond to a data word $D1_n$ and a data word $D2_m$, respectively. Circuit 102 includes an encoder 106 and a transmitter (Tx) 108. Data words $D1_n$ and $D2_m$ can be provided to encoder 106 as, for example, serial or parallel data. Circuit 104 includes decoder 112 and a receiver (Rx) 110. In addition, circuit 104 may also include another encoder (not shown) and a transmitter (not shown) for transmitting encoded data to circuit 102, and circuit 102 may also include a receiver (not shown) and a decoder (not shown) for receiving and decoding the encoded data received from circuit 104.

Encoder 106 receives a first set of n-bit data words $D1_n$ and a second set of m-bit data words $D2_m$ from other circuits (not shown) or other circuit components (e.g., state machines, not shown) within circuit 102. As will be explained in more detail below with references to FIGS. 2-6, encoder 106 includes combinatorial logic gates or look-up tables (LUTs) that are configured to perform encoding of a respective n-bit data word $D1_n$ and a respective m-bit data word $D2_m$ it receives to convert the respective n-bit data word $D1_n$ and the respective m-bit data word $D2_m$ to a corresponding n-bit code word $DQ1_n$ and a corresponding m-bit code word $DQ2_m$, respectively, using the multi-word DBI encoding method herein. As will be explained in more detail below with reference to FIGS. 2-6, encoder 106 uses multi-word DBI encoding by which the Hamming Weights of a plurality of data words (e.g., $D1_n$ and $D2_m$) are considered to determine whether to invert the data bits of each individual data word. For example, if the Hamming Weight of $D1_n$ is HW1 and the Hamming Weight of $D2_m$ is HW2, a combined Hamming Weight (CHW)=HW1+HW2 of the date words $D1_n$ and $D2_m$ is considered to determine DBI1 and DBI2, which indicates whether $D1_n$ and $D2_m$ are inverted to generate $DQ1_n$ and $DQ2_m$, respectively. In some embodiments, the Hamming Weights of the individual data words (e.g., HW1 and HW2) are jointly considered to determine whether to invert each individual word (e.g., $D1_n$ or $D2_m$). As a result, the combined Hamming Weight HWQ of the code words $DQ1_n$ and $DQ2_m$ is limited to a predetermined range. In some embodiments, the predetermined range of HWQ is smaller than the sum of the range of variation of the Hamming Weights of the code words $D1_n$ in the first sequence of code words transmitted over the first group of n parallel transmission lines and the range of variation of the Hamming Weights of the code words $D2_m$ in the second sequence of code words transmitted over the second group of m parallel transmission lines. In other words, using the example illustrated in FIG. 1, $\Delta HWQ < \Delta HWQ1 + \Delta HWQ2$, where $\Delta HWQ1$ represents the range of variation of HWQ1, which represents the Hamming Weight of an individual code word $DQ1_n$, and $\Delta HWQ2$ represents the range of variation of HWQ2, which represents the Hamming Weight of an individual code word $DQ2_m$ transmitted in parallel with code word $DQ1_n$, and $\Delta HWQ$ represents the range of variation of HWQ, which represents the combined HW of the code words $DQ1_n$ and $DQ2_m$ transmitted in parallel (or the HW of a combined n+m bit code word formed by combining the individual code words $DQ1_n$ and $DQ2_m$). In some embodiments, $\Delta HWQ < \Delta HWQ1 + \Delta HWQ2$ is also true when HWQ1 represents the Hamming Weight of the individual code word $DQ1_n$ together with its associated DBI bit, DBI1, and HWQ2 represents the Hamming Weight of the individual code word $DQ2_m$ together with its associated DBI bit, DBI2, and HWQ represents the combined HW of the individual code words $DQ1_n$ and $DQ2_m$ and their associated DBI bits, DBI1 and DBI2 (or the HW of a combined n+m+2 bit code word formed by combining the individual code words $DQ1_n$ and $DQ2_m$ and their associated DBI bits).

Encoder also generates DBI bits, DBI1 and DBI2, corresponding to code words $DQ1_n$ and $DQ2_m$, respectively. The DBI bit, DBI1 or DBI2, is set to logic high ("1") to indicate that the corresponding code word $DQ1_n$ or $DQ2_m$ was encoded by inverting the logic states of the corresponding data word $D1_n$ or $D2_m$, respectively. In contrast, the DBI bit, DBI1 or DBI2, is set to logic low ("0") to indicate that the logic states of the corresponding data word $D1_n$ or $D2_m$ was not inverted in generating the corresponding code word $DQ1_n$ or $DQ2_m$, respectively.

Transmitter (Tx) 108 transmits the code word $DQ1_n$, DBI1 bit, the code word $DQ2_m$, and the DBI2 bit over the parallel link 114 to the receiver (Rx) 110 of circuit 104. In doing so, transmitter (Tx) 108 draws supply current Idd from a power supply (not shown) providing the supply voltage (Vdd), consuming power from the power supply and generating SSO noise. However, the SSO noise generated by transmitter (Tx) 108 can be reduced according to the embodiments of the present disclosure.

Receiver 110 receives the code word $DQ1_n$, the DBI bit DBI1, the code word $DQ2_m$, and the DBI bit DBI2 over the parallel link 114 from circuit 102. In doing so, receiver 110 also draws supply current Idd from a power supply (not shown) providing the supply voltage (Vdd), consuming power from the power supply and generating SSO noise. Again, the SSO noise generated by receiver (Rx) 110 can be reduced according to the embodiments of the present disclosure.

Receiver 110 provides the received code word $DQ1_n$, the DBI1 bit, the code word $DQ2_m$, and the DBI2 bit to decoder 112. Decoder 112 decodes the code word $DQ1_n$ and DBI1 bit back to n-bit data $D1_n$ and decodes the code word $DQ2_m$ and DBI2 bit back to m-bit data $D2_m$. More specifically, decoder 112 inverts the code word $DQ1_n$ back to generate the n-bit data $D1_n$ if the corresponding DBI bit DBI1=1 and outputs the code word $DQ1_n$ as the n-bit data $D1_n$ without further inversion if the corresponding DBI bit DBI1=0. Likewise, decoder 112 inverts the code word $DQ2_m$ back to generate the m-bit data $D2_m$ if the corresponding DBI bit DBI2=1 and outputs the code word $DQ2_m$ as the m-bit data $D2_m$ without further inversion if the corresponding DBI bit DBI2=0.

Figure 2:
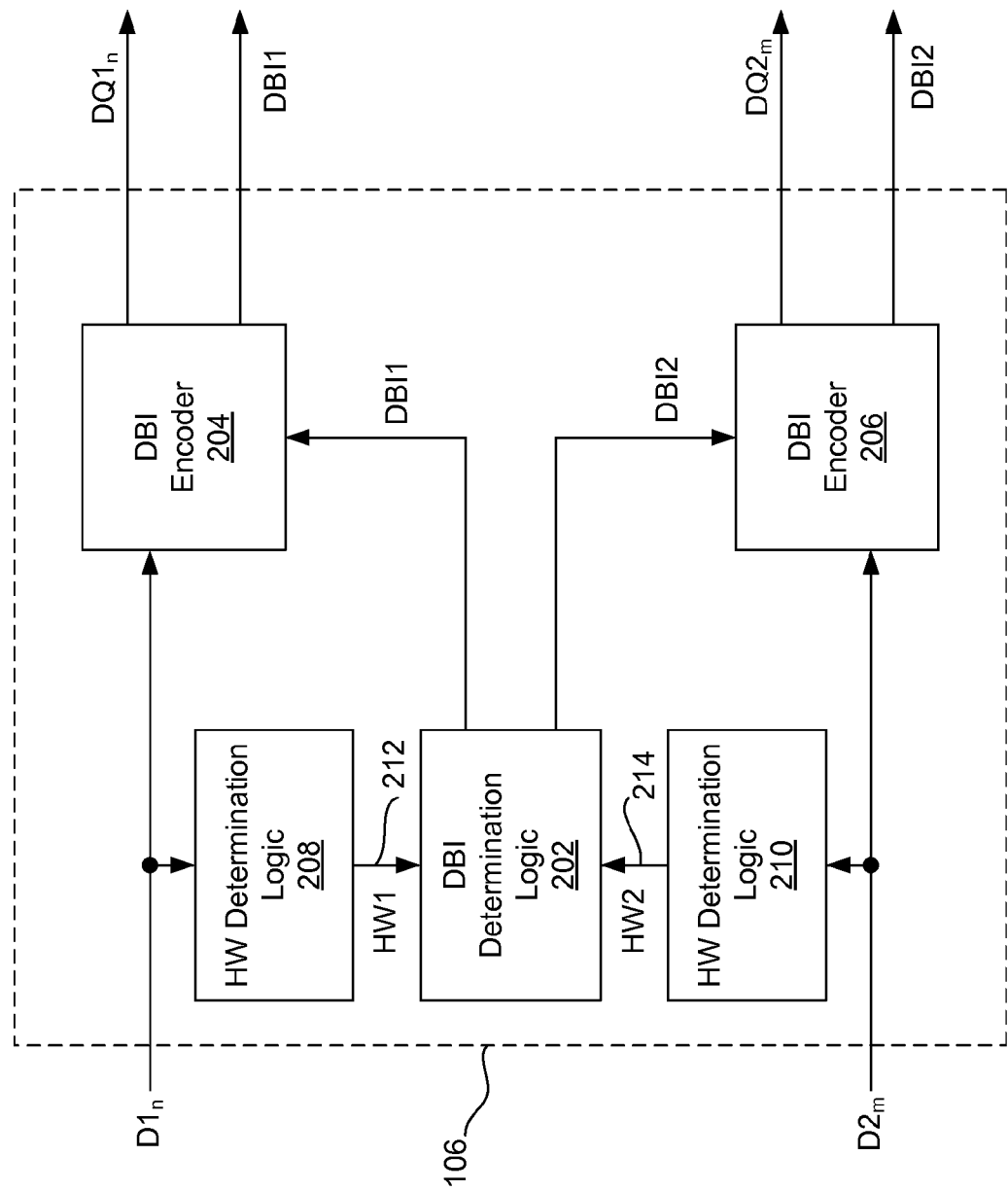
FIG. 2 illustrates the multi-word DBI encoder of FIG. 1 in more detail, according to one embodiment.

FIG. 2 illustrates the multi-word DBI encoder of FIG. 1 in more detail, according to one embodiment. Encoder 106 includes HW determination logic 208, 210, DBI determination logic 202, and DBI encoders 204, 206. HW determination logic 208 receives the data word $D1_n$ and determines the HW (HW1) of the data word $D1_n$. The determined HW1 is output 212 to DBI determination logic 202. On the other hand, HW determination logic 210 receives the data word $D2_m$ and determines the HW (HW2) of the data word $D2_m$.

The determined HW2 is output 214 to DBI determination logic 202.

Figure 3:
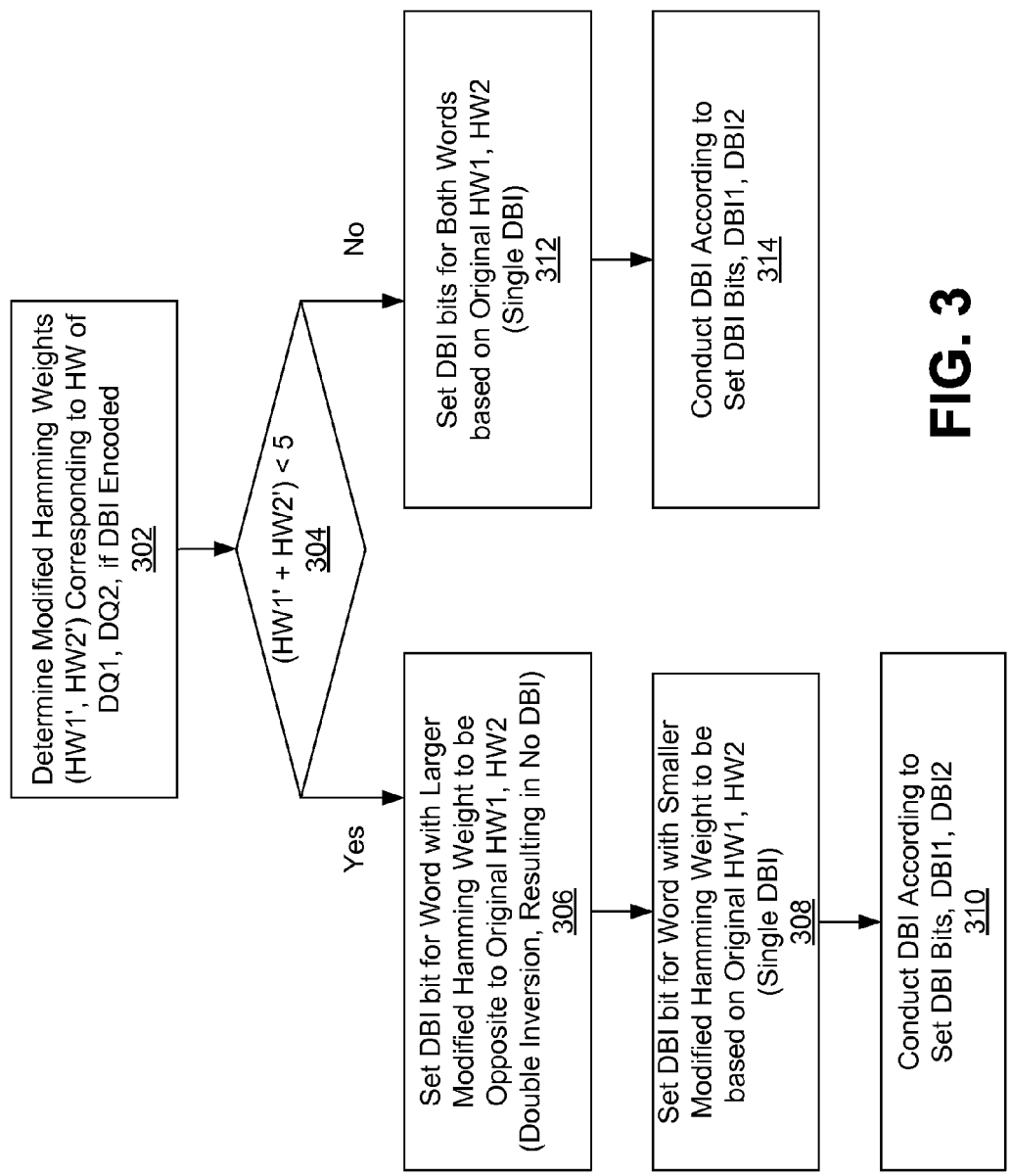
FIG. 3 illustrates a method of multi-word DBI encoding, according to one embodiment.
Figure 5:
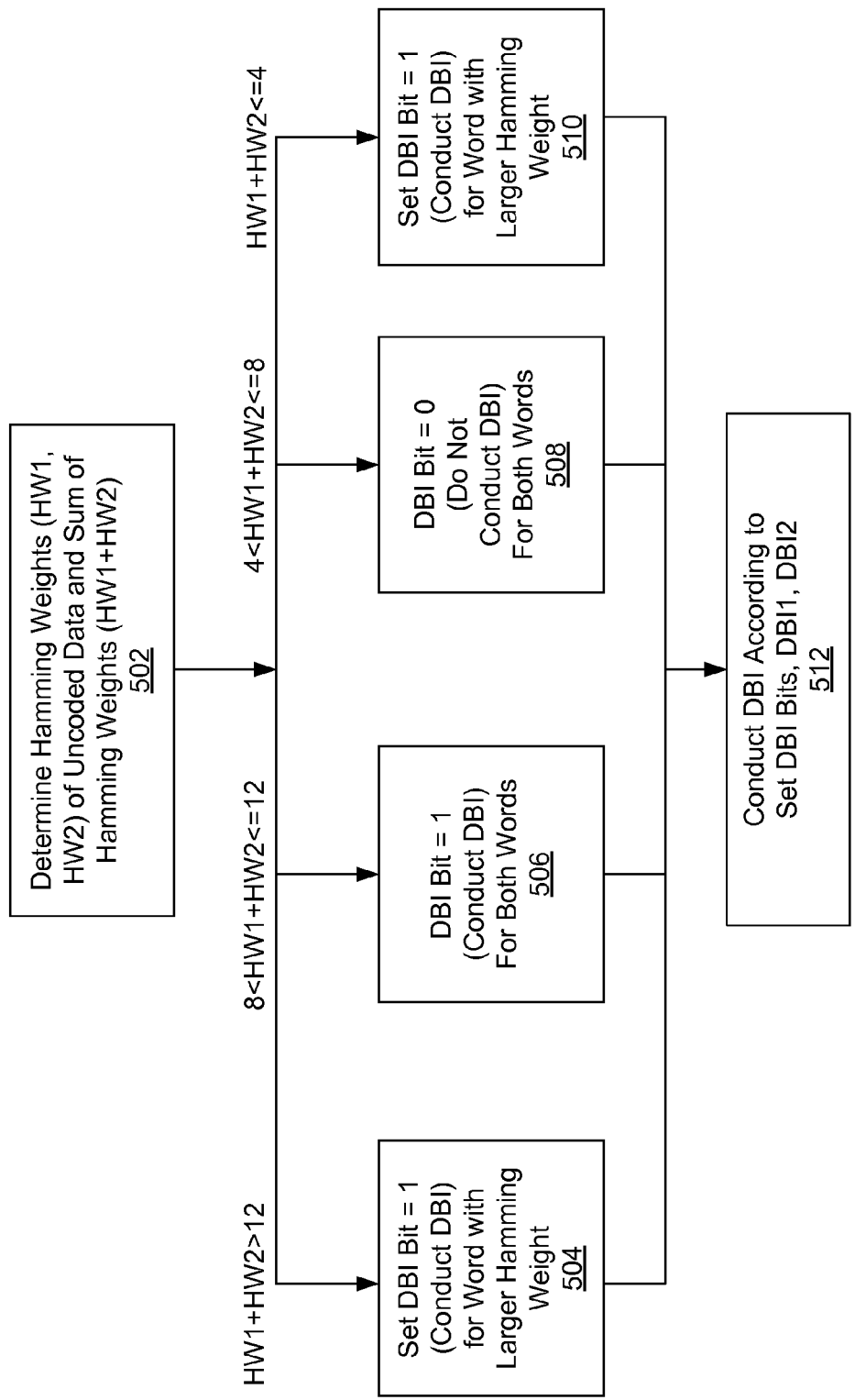
FIG. 5 illustrates a method of multi-word DBI encoding, according to another embodiment.

DBI determination logic 202 determines whether or not the input data word $D1_n$ and/or $D2_m$ should be inverted, using the methods according to the embodiments illustrated in FIG. 3 or FIG. 5. If DBI determination logic 202 determines that data word $D1_n$ should be inverted, the DBI1 bit is set to logic high ("1"). If DBI determination logic 202 determines that data word $D2_m$ should be inverted, the DBI2 bit is set to logic high ("1").

DBI encoder 204 receives the data word $D1_n$ and the DBI1 bit, and conducts DBI encoding according to the indications of the DBI1 bit. If DBI1 bit is set to logic high ("1"), DBI encoder 204 generates the code word $DQ1_n$ by inverting the logic state of each bit of the data word $D1_n$. If DBI1 bit is set to logic low ("0"), DBI encoder 204 outputs the data word $D1_n$ as the code word $DQ1_n$ without inverting the logic states of the bits of the data word $D1_n$. Then, DBI encoder 204 outputs the code word $DQ1_n$ with the DBI1 bit.

Similarly, DBI encoder 206 receives the data word $D2_m$ and the DBI2 bit, and conducts DBI encoding according to the indications of the DBI2 bit. If the DBI2 bit is set to logic high ("1"), DBI encoder 206 generates the code word $DQ2_m$ by inverting the logic state of each bit of the data word $D2_m$. If the DBI2 bit is set to logic low ("0"), DBI encoder 206 outputs the data word $D2_m$ as the code word $DQ2_m$ without inverting the logic states of the bits of the data word $D2_m$. Then, DBI encoder 206 outputs the code word $DQ2_m$ with the DBI2 bit.

FIG. 3 illustrates a method of multi-word DBI encoding, according to one embodiment. The embodiment of FIG. 3 uses modified HWs (defined below) to determine whether to conduct DBI on a particular word of the input data. For the purposes of the examples herein described in FIG. 3, it will be assumed that each of the data words $D_n$ and $D2_m$ are 8-bit (1-byte) words, although input data $D1_n$ and $D2_m$ may be words with different number of bits.

First, DBI determination logic 202 receives HW1 and HW2 of the input data words $D1_n$ and $D2_m$ from HW determination logic 208, 210, respectively, and then determines 302 the modified Hamming Weights HW1' and HW2' corresponding to HW1 and HW2, respectively. The modified Hamming Weights HW1' and HW2' are computed from the Hamming Weights of input data $D_n$ and $D2_m$, respectively, according to predetermined rules. For example, HW1' and HW2' can be determined as follows: (1) HW1'=9−HW1 if HW1>4, (2) HW1'=HW1 if HW1<=4, (3) HW2'=9−HW2 if HW2>4, and (4) HW2'=HW2 if HW2<=4. These rules are based on the rationale that the number of zeros in an 8-bit word becomes the number of ones in a DBI-encoded (inverted) 8-bit word and the corresponding DBI bit would be set to "1" if the 8-bit word is inverted. Note that the input data $D1_n$ and $D2_m$ are not actually inverted in step 302 to determine the modified HW1' and HW2'. DBI determination logic 202 determines 304 whether or not the sum of the modified HWs (HW1'+HW2') is less than 5, and sets the DBI bits DBI1 and DBI2 for input data ($D1_n$ and $D2_m$) differently and thus conducts DBI differently, depending on the outcome of step 304.

Specifically, if the sum (HW1'+HW2') is less than 5, then the DBI bits (DBI1 and DBI2) are set such that either of the words with the larger modified Hamming Weight (HW1' or HW2') is encoded opposite to what conventional DBI-encoding would require. For example, conventional DBI would require the DBI bit for an 8-bit word to be set at logic high ("1") when the HW of the 8-bit word exceeds 4. However, in step 306, the DBI bit (DBI1 or DBI2) for the word with the larger modified Hamming Weight (HW1' or HW2') is set to logic low ("0") if the word has original HW exceeding 4 and to logic high ("1") if the word has original HW not exceeding 4. Original HW refers to the HW of the un-encoded input data words (DBI1 or DBI2). Also, in step 308, the DBI bit (DBI1 or DBI2) for the word that is not with the larger modified Hamming Weight (HW1' or HW2') is set according to what the original HW of the word dictates under conventional DBI encoding. Thus, in step 308, the DBI bit (DBI1 or DBI2) for the word with the smaller modified Hamming Weight (HW1' or HW2') is set to logic high ("1") when the word has original HW exceeding 4 and to logic low ("1") if the word has original HW not exceeding 4. Then, DBI encoders 204, 206 conduct 310 DBI encoding upon the input data ($D1_n$ and $D2_m$) according to the set DBI bits (DBI1, DBI2). Note that, even with the DBI setting according to the steps 306, 308, the meaning of the DBI bits (DBI1 and DBI2) still remain the same, i.e., the input data word ($D1_n$ and $D2_m$) is inverted if the corresponding DBI bit (DBI1 and DBI2) is set to logic high ("1"). Thus, decoder 112 can decode the data encoded using the multi-word DBI encoding scheme simply by using conventional DBI decoding schemes, making the multi-word DBI encoding scheme according to the embodiments herein backward compatible with conventional DBI decoders.

On the other hand, if the sum (HW1'+HW2') of the modified HWs is not less than 5, then the DBI bits (DBI1 and DBI2) are set 312 for both of the words according to what conventional DBI-encoding would require for each word based on the original HWs. For example, the DBI bit (DBI1 or DBI2) is set to logic high ("1") if the corresponding original HW (HW1 or HW2, respectively) exceeds 4, and the DBI bit (DBI1 or DBI2) is set to logic low ("1") if the corresponding original HW (HW1 or HW2, respectively) does not exceed 4. Then, DBI encoders 204, 206 conduct 314 DBI encoding upon the input data ($D1_n$ and $D2_m$) according to the set DBI bits (DBI1, DBI2).

As can be seen from the method of FIG. 3, the determination of whether or not the input data ($D1_n$ and $D2_m$) will be inverted for DBI encoding depends on the sum (HW1'+HW2') of the modified HWs, which in turn depends on the sum of the original HWs (HW1, HW2) of the individual words ($D1_n$ and $D2_m$). Also, further determination of whether or not the input data ($D1_n$ and $D2_m$) will be inverted for DBI encoding is also made based on the individual original HWs (HW1, HW2) of the individual word ($D1_n$ or $D2_m$) in steps 306 and 308. Because HWs of the combined words ($D1_n$ and $D2_m$) are taken into consideration in the DBI-encoding according to the embodiments herein, it is possible to encode the input data ($D1_n$ and $D2_m$) in a manner that would further reduce SSN in the combined encoded words ($DQ1_n$ and $DQ2_m$) compared to conventional DBI encoding that merely performs DBI encoding only based on the HW (HW1 or HW2) of the individual words ($D1_n$ and $D2_m$) on a word-by-word basis.

Figure 4:
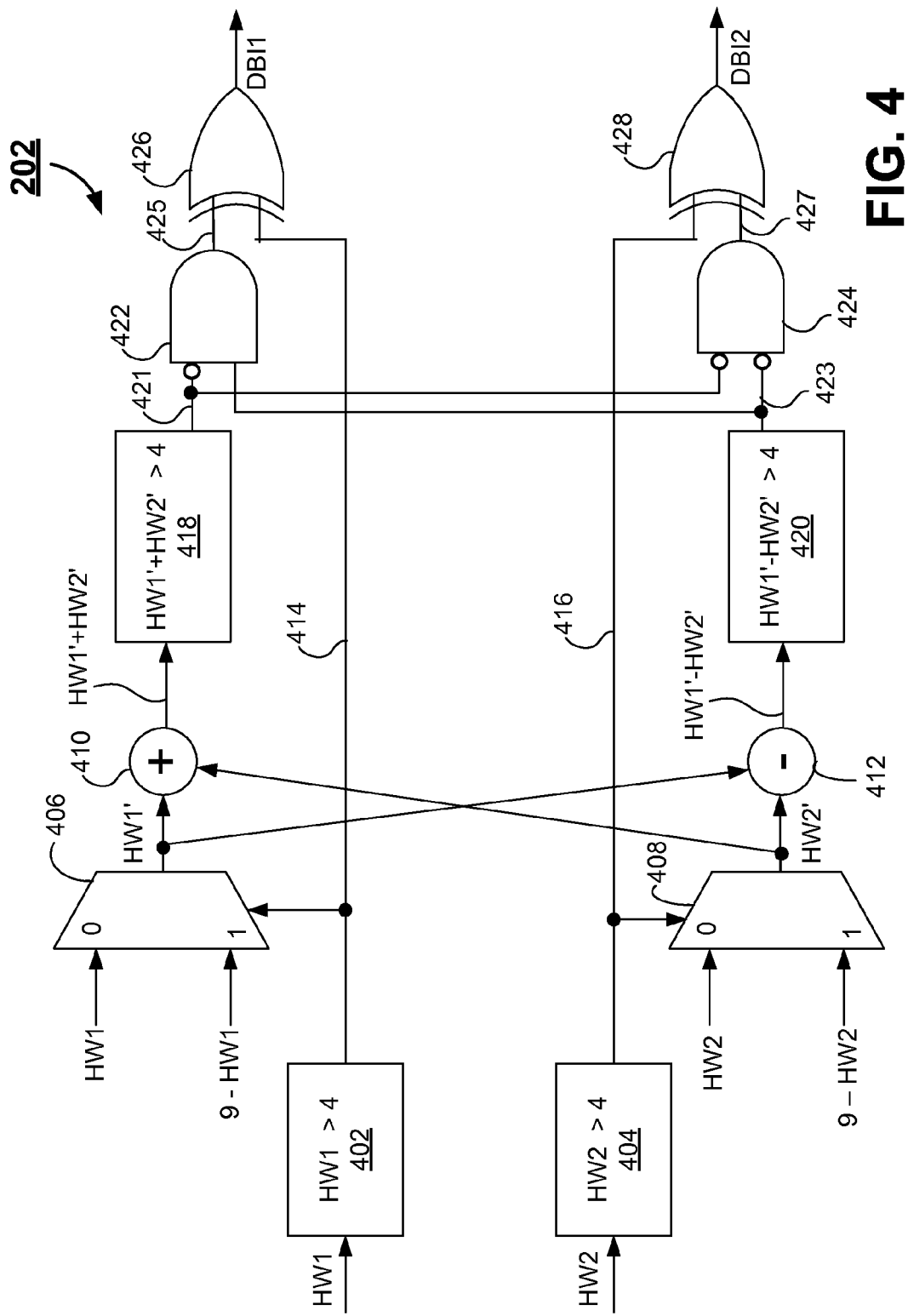
FIG. 4 illustrates example circuitry of the DBI determination logic in the multi-word encoder of FIG. 2 using the method illustrated in FIG. 3, according to one embodiment.

FIG. 4 illustrates example circuitry of the DBI determination logic in the multi-word encoder of FIG. 2 using the method of FIG. 3, according to one embodiment. The DBI determination logic circuitry 202 of FIG. 4 implements the DBI determination method of FIG. 3. First, comparators 402, 404 generate output signals 414, 416 that are asserted (logic high "1")) if the original HWs (HW1, HW2) exceed 4, or not asserted (logic low "0") if the original HWs (HW1, HW2) do not exceed 4. Multiplexer 406 selects either the original HW1 if signal 414 is not asserted (HW1<=4) or (9-HW1) if signal 414 is asserted (HW1>4). Thus, multiplexer 406 outputs the modified HW1' for input word ($D1_n$). Multiplexer 408 selects either the original HW2 if signal 416 is not asserted (HW2<=4) or (9-HW2) if signal 416 is asserted (HW2>4).

Thus, multiplexer 408 outputs the modified HW2' corresponding to input word (D2$_m$). Adder 410 generates the sum (HW1'+HW2') of the modified Hamming Weights (HW1', HW2'). Subtractor 412 generates the difference (HW1'–HW2') between the modified Hamming Weights (HW1', HW2'). Thus, multiplexers 406, 408 together with comparators 402, 404 perform the function of step 302 in the method of FIG. 3.

Comparator 418 generates output signal 421 that is asserted (logic high "1") when the sum (HW1'+HW2') of the modified HWs for the combined input words (D1$_n$ and D2$_m$) exceeds 4 (i.e., not less than 5), as in step 304 of the method of FIG. 3. Comparator 420 generates output signal 423 that is asserted (logic high "1") when the difference (HW1'–HW2') of the modified HWs between the combined input words (D1$_n$ and D2$_m$) exceeds 0 (i.e., HW1'>HW2'), in order to determine which of the two words (D1$_n$ and D2$_m$) has the greater modified Hamming Weight (HW1', HW2') as in step 306 of the method of FIG. 3.

AND gate 422 generates an output signal 425 that is at logic high ("1") if the sum of the modified HWs (HW1'+HW2') is less than 5 (i.e., not greater than 4) as indicated by signal 421 (signal 421="0") and HW1'>HW2' as indicated by signal 423 (signal 423="1"). This situation corresponds to when the word D1$_n$ is the word with the larger modified HW and the word D2$_n$ is the word with the smaller modified HW in step 306 in the method of FIG. 3. In this case, the output 427 of AND gate 424 would be at logic low ("0") because signal 421="0" and signal 423="1". Thus, the DBI bit (DBI1) for word D1$_n$, which is the output signal of XOR gate 426, is at logic low ("0") when the original HW1>4 and at logic high ("1") when the original HW1<=4, which is opposite to what conventional DBI encoding would require for word D1$_n$. On the other hand, DBI bit (DBI2) for word D2$_m$, which is the output signal of XOR gate 428, is at logic high ("1") when the original HW2>4 and at logic low ("0") when the original HW2<=4, which is consistent what conventional DBI encoding would require for word D2$_m$. Thus, the resulting DBI1, DBI2 bits are consistent with steps 306 and 308 of the method of FIG. 3.

If the sum of the modified HWs (HW1'+HW2') is less than 5 (i.e., not greater than 4) as indicated by signal 421 (signal 421="0") but HW1'<=HW2' as indicated by signal 423 (signal 423="0"), then the output signal 425 of AND gate 422 is at logic low ("0"). This situation corresponds to when the word D2$_n$ is the word with the larger modified HW and the word D1$_n$ is the word with the smaller modified HW in step 306 in the method of FIG. 3. The output 427 of AND gate 424 would be at logic high ("1") because signal 421="0" and signal 423="0". Thus, the DBI bit (DBI2) for word D2$_m$, which is the output signal of XOR gate 428, is at logic low ("0") when the original HW2>4 and at logic high ("1") when the original HW2<=4, which is opposite to what conventional DBI encoding would require for DBI2 word D2$_m$. On the other hand, DBI bit (DBI1) for word D1$_n$, which is the output signal of XOR gate 426, is at logic high ("1") when the original HW1>4 and at logic low ("0") when the original HW1<=4, which is consistent what conventional DBI encoding would require for DBI1 word D1$_n$. Thus, again, the resulting DBI1, DBI2 bits are consistent with steps 306 and 308 of the method of FIG. 3.

If the sum of the modified HWs (HW1'+HW2') is not less than 5 (i.e., greater than 4) as indicated by signal 421 (signal 421="1"), then the output 425 of AND gate 422 and the output 427 of AND gate 424 are at logic low ("0") regardless of the output signal 423 from comparator 420. Thus, DBI1 is at logic high "1" when the original HW1>4 and DBI1 is at logic low "0" when the original HW1<=4. Similarly, DBI2 is at logic high "1" when the original HW2>4 and DBI2 is at logic low "0" when the original HW2<=4. Thus, the DBI bits (DBI1 and DBI2) for both words (D1$_n$ and D2$_m$) are set based on what the original HWs (HW1, HW2) would require under conventional DBI, which is consistent with step 312 of the DBI encoding method of FIG. 3.

FIG. 5 illustrates a method of multi-word DBI encoding, according to another embodiment. The embodiment of FIG. 5 performs DBI encoding equivalent to that of the embodiment described with reference to FIG. 3 above, but uses the original HWs of the multiple words rather than their modified HWs to determine whether to invert a particular word. For the purposes of the examples herein described in FIG. 5, it will continue to be assumed that each of the input data words D1$_n$ and D2$_m$ is 8-bit words, although input data D1$_n$ and D2$_m$ may be words with different number of bits.

First, DBI determination logic 202 receives HW1 and HW2 of the input data D1$_n$ and D2$_m$ from HW determination logic 208, 210, respectively, and then determines 502 the sum (HW1+HW2) of the original Hamming Weights corresponding to input words D1$_n$ and D2$_m$, respectively. Then, DBI determination logic 202 conducts different type of encoding depending upon the value of the sum (HW1+HW2) of the original Hamming Weights.

Specifically, if (HW1+HW2) exceeds 12, in step 504 the DBI bit of the word (D1$_n$ or D2$_m$) with the larger HW (HW1 or HW2) is set to logic high ("1") so that such word is inverted, while the DBI bit of the remaining word (D1$_n$ or D2$_m$) is set to logic low ("0") so that such word is not inverted. If HW1=HW2, then either one of DBI1 and DBI2 can be set to logic high ("1"), for example DBI2=1. If (HW1+HW2) exceeds 8 but does not exceed 12, in step 506 the DBI bits of both of the words (D1$_n$ and D2$_m$) are set to logic high ("1") regardless of the HW values so that both words are inverted by DBI. If (HW1+HW2) exceeds 4 but does not exceed 8, in step 508 the DBI bits of both of the words (D1$_n$ and D2$_m$) are set to logic low ("0") regardless of the HW values so that neither word is inverted. If (HW1+HW2) does not exceed 4, in step 510 the DBI bit of the word (D1$_n$ or D2$_m$) with the larger HW (HW1 or HW2) is set to logic high ("1") so that such word is inverted, while the DBI bit of the remaining word is set to logic low ("0") so that such word is not inverted. If HW1=HW2, then either one of DBI1 and DBI2 can be set to logic high ("1"), for example DBI2=1. Then, the words (D1$_n$ and D2$_m$) are encoded 512 according to the set DBI bits (DBI1 and DBI2, respectively), i.e., inverted when the corresponding DBI bit is set to logic high ("1") or not inverted when the corresponding DBI bit is set to logic low ("0").

As can be seen from the method of FIG. 5, the determination of whether or not the input data (D1$_n$ and D2$_m$) will be inverted for DBI encoding likewise depends on the sum (HW1+HW2) of the original HWs (HW1, HW2) of the data words (D1$_n$ and D2$_m$). Also, further determination of whether or not the input data (D1$_n$ and D2$_m$) will be inverted for DBI encoding is also made based on the original HWs (HW1, HW2) of the individual words (D1$_n$ or D2$_m$) in steps 504 and 510. Because the HW of the combined word (D1$_n$ and D2$_m$) is taken into consideration in DBI-encoding according to the embodiments herein, it is possible to encode the input data (D1$_n$ and D2$_m$) in a manner that would further reduce SSN in transmitting the encoded words (DQ1$_n$ and DQ2$_m$) compared to conventional DBI encoding that merely performs DBI encoding only based on the HW (HW1 or HW2) of the individual words (D1$_n$ and D2$_m$) on a word-by-word basis.

Figure 6:
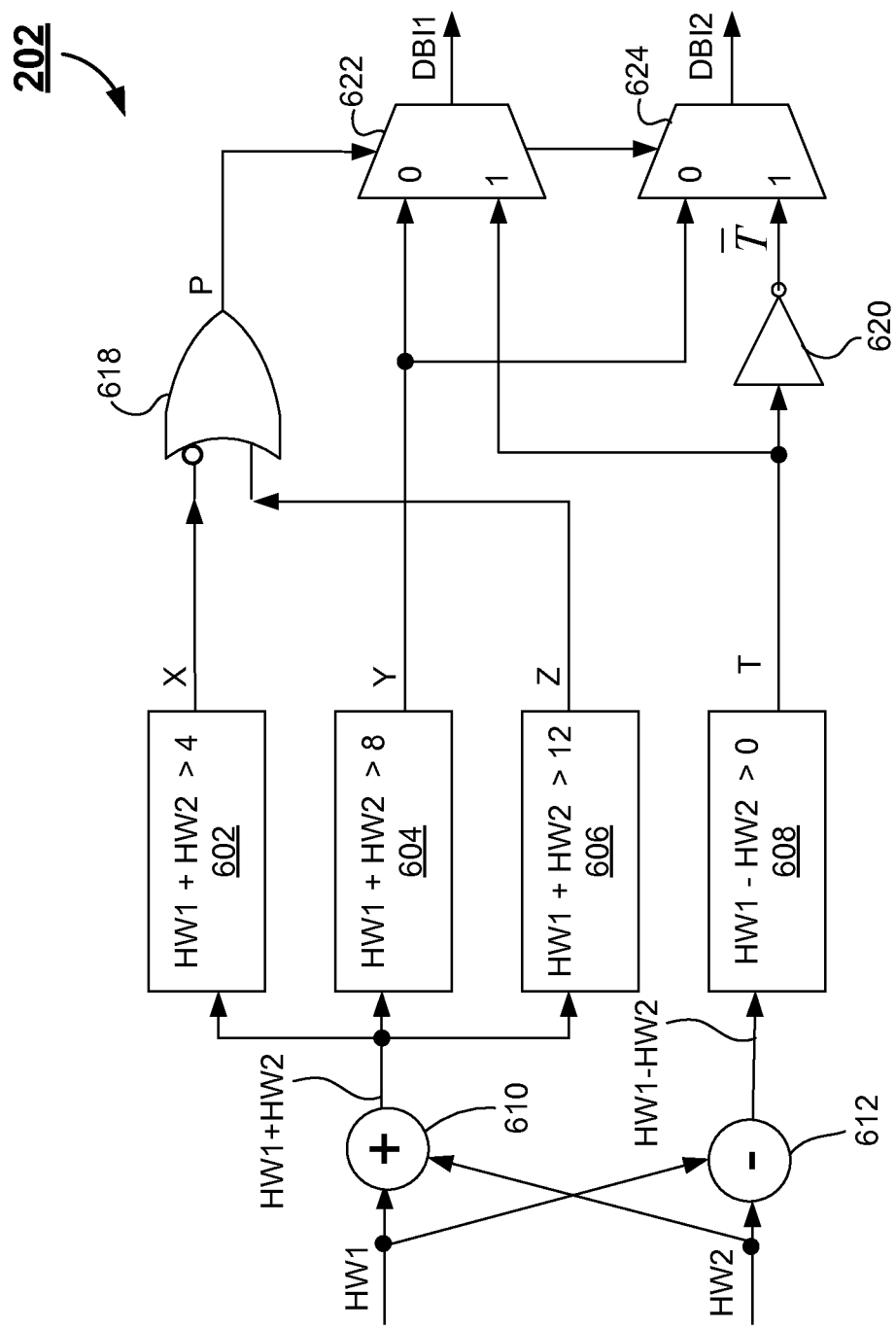
FIG. 6 illustrates example circuitry of the DBI determination logic in the multi-word encoder of FIG. 2 using the method illustrated in FIG. 5, according to another embodiment.

FIG. 6 illustrates example circuitry of the DBI determination logic in the multi-word encoder of FIG. 2 using the method of FIG. 5, according to another embodiment. The circuitry of FIG. 6 implements the DBI determination method of FIG. 5. DBI determination logic 202 includes an adder 610 and subtractor 612. Adder 610 generates the sum (HW1+HW2) of the original HWs of the words (D1$_n$ and D2$_m$), and subtractor 612 generates the difference (HW1−HW2) of the original HWs of the words (D1$_n$ and D2$_m$). Comparators 602, 604, 606 generate output signals X, Y, Z that are logic high ("1") when the sum (HW1+HW2) of the HWs exceeds 4, 8, 12, respectively, and are logic low when the sum (HW1+HW2) of the HWS does not exceed 4, 8, 12, respectively. Comparator 608 generates output signal T that is at logic high ("1") when HW1>HW2 and logic low ("0") when HW<=HW2.

XOR gate 618 receives $\overline{X}$ and Z and generates output signal P, used as selection signal for multiplexers 622 and 624. Multiplexer 622 selects either Y or T as its output signal DBI1 corresponding to input word (D1$_n$) depending upon selection signal P. Multiplexer 624 selects either Y or $\overline{T}$ (through inverter 620) as its output signal DBI2 corresponding to input word (D2$_m$) depending upon selection signal P. The logic Table 1 below illustrates how the circuit of FIG. 6 generates DBI1 and DBI2 depending upon the different combinations of HW1 and HW2 consistent with the method described in FIG. 5.

TABLE 1

| HW1 + HW2 | X | Y | Z | DBI1 | DBI2 |
|---|---|---|---|---|---|
| 0-4 (FIG. 5, step 510) | 0 | 0 | 0 | T | $\overline{T}$ |
| 5-8 (FIG. 5, step 508) | 1 | 0 | 0 | 0 | 0 |
| 9-12 (FIG. 5, step 506) | 1 | 1 | 0 | 1 | 1 |
| 13-16 (FIG. 5, step 504) | 1 | 1 | 1 | T | $\overline{T}$ |

As can be seen from Table 1 above, if (HW1+HW2) is in the range of 13-16, DBI bits (DBI1 and DBI2) are T and or $\overline{T}$, respectively, and thus, DBI1=1 and DBI2=0 if HW1>HW2 and DBI1=0 and DBI2=1 if HW1<=HW2, consistent with step 504 of FIG. 5. If (HW1+HW2) is in the range of 9-12, both DBI bits (DBI1 and DBI2) are set to "1" consistent with step 506 of FIG. 5. If (HW1+HW2) is in the range of 5-8, both DBI bits (DBI1 and DBI2) are set to "0" consistent with step 508 of FIG. 5. Finally, if (HW1+HW2) is in the range of 0-4, DBI bits (DBI1 and DBI2) are set to T and or $\overline{T}$, respectively, and thus, DBI1=1 and DBI2=0 if HW1>HW2 and DBI1=0 and DBI2=1 if HW1<=HW2, consistent with step 510 of FIG. 5.

Figure 7A:
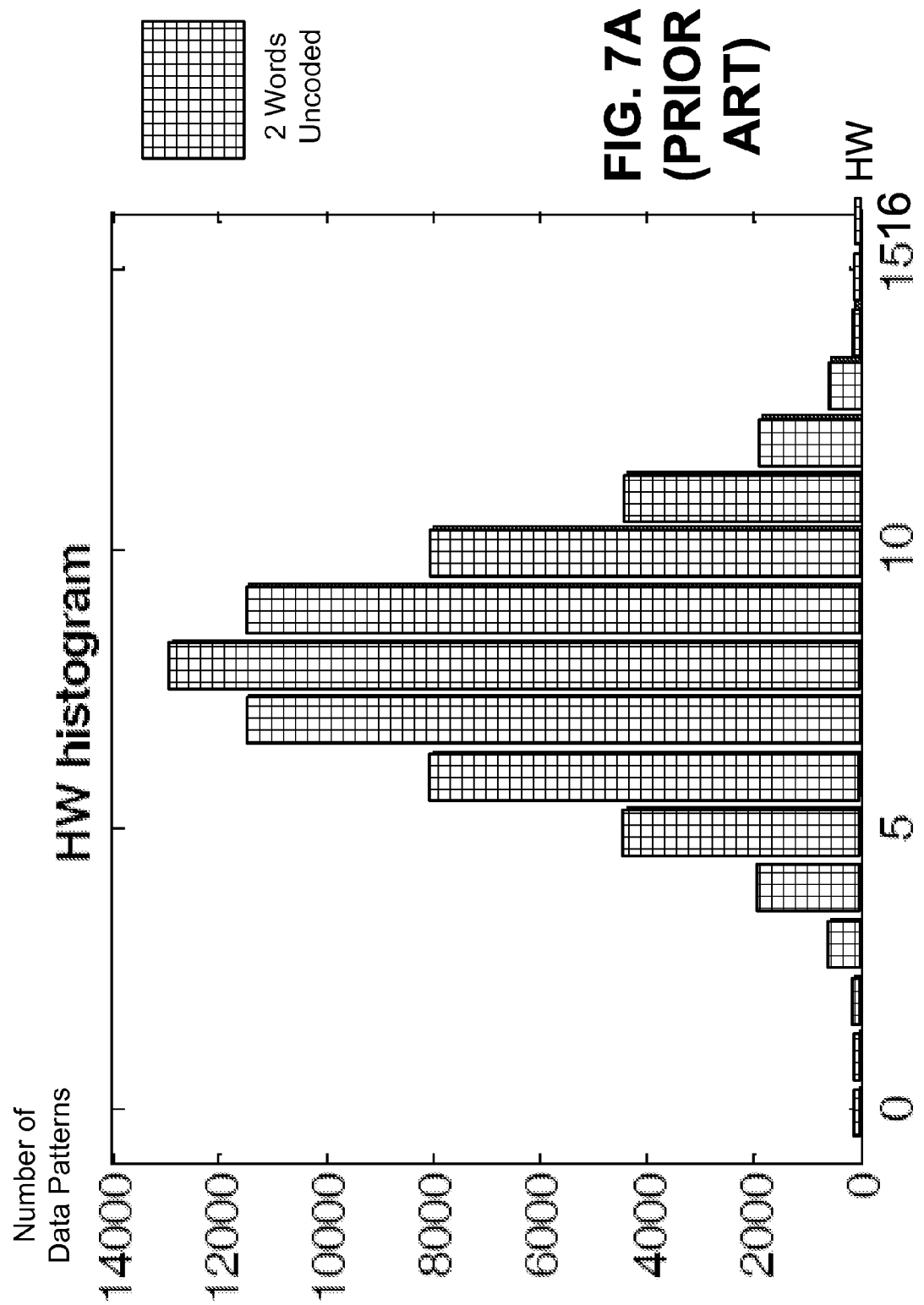
FIG. 7A illustrates HW distribution in uncoded 2-word (16-bit) data.

FIG. 7A illustrates HW distribution in un-coded 2-word (e.g., 16-bit) data. Assuming each word has 8 bits, two words would have HW distribution of 0-16 with the number of data patterns as shown in FIG. 7A. The wide range (16) of variation of HWs between HWs of 0 to 16 generates significant SSN when such un-coded words are transmitted over a parallel communication link.

Figure 7B:
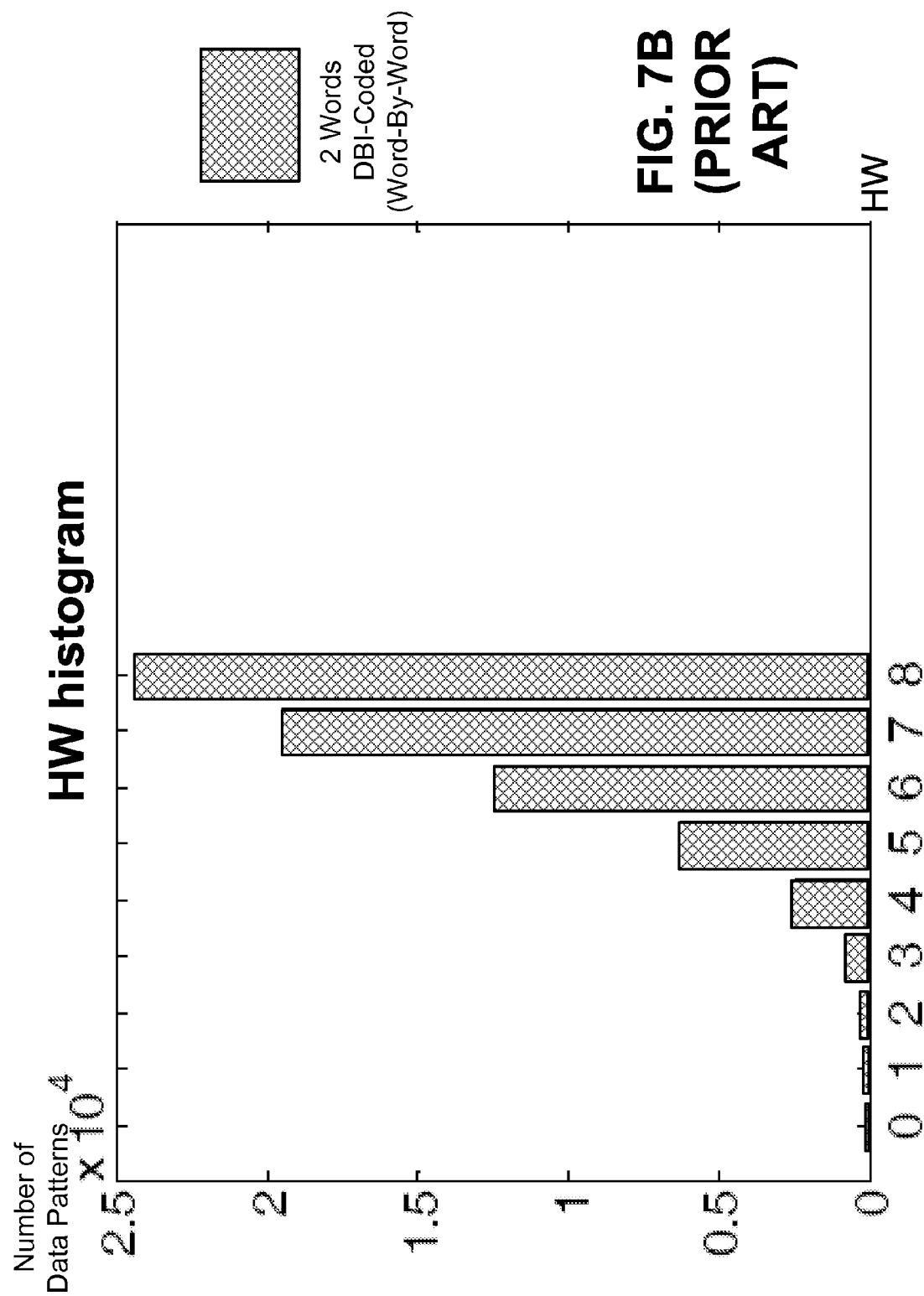
FIG. 7B illustrates HW distribution in conventional DBI-encoded 2-word (16-bit) data.

FIG. 7B illustrates HW distribution in conventional DBI-encoded 2-word (e.g., 16-bit) data. In conventional DBI encoding, assuming each word has 8 bits, the logic states of the bits of each word can be inverted if the HW of that individual word exceeds 4. Since each word has HW in the range of 0-8, each conventional DBI-encoded word has HW in the range of 0-4. Thus, the combined two words that are conventional DBI-encoded have HWs in the range of 0-8 as shown in FIG. 7B. Thus, conventional DBI encoding allows a narrower range (8) of variation of HWs between HWs of 0 to 8, and SSN noise can be reduced by 50% compared to un-encoded transmission of 2 words. However, note that under the conventional DBI encoding scheme, SSN is reduced merely by 50% regardless of the number of words to be transmitted, because each word is DBI encoded individually on a word-by-word basis without considering the overall HW of the combined word.

Figure 7C:
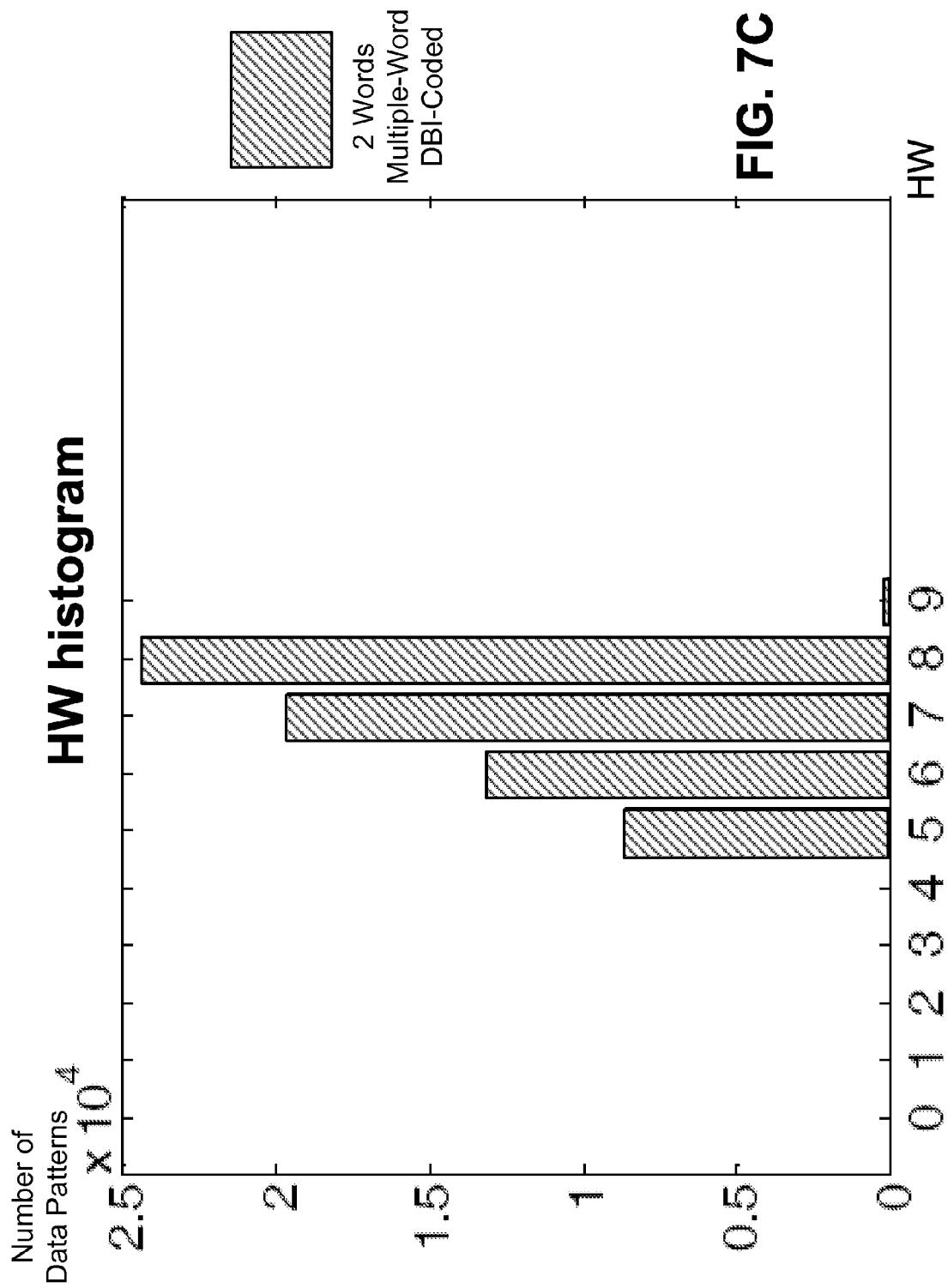
FIG. 7C illustrates HW distribution in multi-word DBI encoded 2-word (16-bit) data encoded according to the multi-word DBI encoding methods of the present disclosure.

FIG. 7C illustrates HW distribution for the multi-word DBI encoded 2-word (e.g., 16-bit) data according to one embodiment of the present disclosure. Assuming that each word has 8 bits, the following tables (Table 2, 3, 4, and 5) illustrate the sum of the HWs of the combined encoded words (DQ1$_n$ and DQ2$_m$) if each word (D1$_n$ and D2$_m$) is DBI-encoded according to the embodiments described above with reference to steps 510, 508, 506, and 504, respectively, of FIG. 5. In Table 2, 3, 4, and 5 below, the HW pair shown as (value 1, value 2) may correspond to the HW pair (HWQ1, HWQ2) or the HW pair (HWQ2, HWQ1), and thus the order of these HW values is interchangeable. Only one interchangeable combination is shown in the tables for simplicity of illustration. For example, the HW pair (HWQ1, HWQ2)=(0, 1) and the HW pair (HWQ2, HWQ1)=(1,0) would result in the same sum of Hamming Weights of the encoded words DQ1$_n$ and DQ2$_m$ (including DBI1 and DBI2) and thus need not be repeated separately in the tables below.

TABLE 2

(HW1 + HW2 <= 4: Word with larger HW is inverted and DBI bit = 1 for inverted word)

| Hamming Weight pair of input words D1$_n$ and D2$_m$ | Hamming Weight pair of combination of encoded words with DBI bit, DQ1$_n$/ DBI1 and DQ2$_m$/DBI2 | Sum of Hamming Weights of encoded words DQ1$_n$ and DQ2$_m$, DBI1 and DBI2 |
|---|---|---|
| (0, 0) | (0, 9) | 9 |
| (0, 1) | (0, 8) | 8 |
| (0, 2) | (0, 7) | 7 |
| (1, 1) | (1, 8) | 9 |
| (0, 3) | (0, 6) | 6 |
| (1, 2) | (1, 7) | 8 |
| (0, 4) | (0, 5) | 5 |
| (1, 3) | (1, 6) | 7 |
| (2, 2) | (2, 7) | 9 |

TABLE 3

(4 < HW1 + HW2 <= 8: neither word is inverted and DBI bit = 0 for both words)

| Hamming Weight pair of input words D1$_n$ and D2$_m$ | Hamming Weight pair of combined encoded words with DBI bit, DQ1$_n$/ DBI1 and DQ2$_m$/DBI2 | Sum of Hamming Weights of encoded words DQ1$_n$ and DQ2$_m$, DBI1 and DBI2 |
|---|---|---|
| (0, 5) | (0, 5) | 5 |
| (1, 4) | (1, 4) | 5 |
| (2, 3) | (2, 3) | 5 |
| (0, 6) | (0, 6) | 6 |
| (1, 5) | (1, 5) | 6 |
| (2, 4) | (2, 4) | 6 |
| (3, 3) | (3, 3) | 6 |
| (0, 7) | (0, 7) | 7 |
| (1, 6) | (1, 6) | 7 |
| (2, 5) | (2, 5) | 7 |
| (3, 4) | (3, 4) | 7 |
| (0, 8) | (0, 8) | 8 |
| (1, 7) | (1, 7) | 8 |
| (2, 6) | (2, 6) | 8 |

TABLE 3-continued (4 < HW1 + HW2 <= 8: neither word is inverted and DBI bit = 0 for both words)

| Hamming Weight pair of input words $D1_n$ and $D2_m$ | Hamming Weight pair of combined encoded words with DBI bit, $DQ1_n$/ DBI1 and $DQ2_m$/DBI2 | Sum of Hamming Weights of encoded words $DQ1_n$ and $DQ2_m$, DBI1 and DBI2 |
|---|---|---|
| (3, 5) | (3, 5) | 8 |
| (4, 4) | (4, 4) | 8 |

TABLE 4

(8 < HW1 + HW2 <= 12: both words are inverted and DBI bit = 1 for both words)

| Hamming Weight pair of input words $D1_n$ and $D2_m$ | Hamming Weight pair of combined encoded words with DBI bit, $DQ1_n$/ DBI1 and $DQ2_m$/DBI2 | Sum of Hamming Weights of encoded words $DQ1_n$ and $DQ2_m$, DBI1 and DBI2 |
|---|---|---|
| (1, 8) | (8, 1) | 9 |
| (2, 7) | (7, 2) | 9 |
| (3, 6) | (6, 3) | 9 |
| (4, 5) | (5, 4) | 9 |
| (2, 8) | (7, 1) | 8 |
| (3, 7) | (6, 2) | 8 |
| (4, 6) | (5, 3) | 8 |
| (5, 5) | (4, 4) | 8 |
| (3, 8) | (6, 1) | 7 |
| (4, 7) | (5, 2) | 7 |
| (5, 6) | (4, 3) | 7 |
| (4, 8) | (5, 1) | 6 |
| (5, 7) | (4, 2) | 6 |
| (6, 6) | (3, 3) | 6 |

TABLE 5

(HW1 + HW2 > 12: Word with larger HW is inverted and DBI bit = 1 for inverted word)

| Hamming Weight pair of input words $D1_n$ and $D2_m$ | Hamming Weight pair of combination of encoded words with DBI bit, $DQ1_n$/ DBI1 and $DQ2_m$/DBI2 | Sum of Hamming Weights of encoded words $DQ1_n$ and $DQ2_m$, DBI1 and DBI2 |
|---|---|---|
| (5, 8) | (5, 1) | 6 |
| (6, 7) | (6, 2) | 8 |
| (6, 8) | (6, 1) | 7 |
| (7, 7) | (7, 2) | 9 |
| (7, 8) | (7, 1) | 8 |
| (8, 8) | (8, 1) | 9 |

As shown in Tables 2, 3, 4, and 5 above, the sum of the Hamming Weights of the encoded words ($DQ1_n$ and $DQ2_m$) including DBI bits (DBI1 and DBI2) are in the range of 5-9. This range is significantly narrower compared to the corresponding range of HW variation achieved using conventional DBI encoding techniques. This is illustrated in FIG. 7C, where the two words that are multiple-word DBI-encoded according to the embodiments herein have data patterns with HWs only in the range of 5, 6, 7, 8, and 9. This range has an associated Hamming Weight variation of ΔHWQ that is the difference between the highest Hamming Weight and the lowest Hamming Weight in the range (e.g., ΔHWQ=9−5=4). Thus, the range of variation ΔHWQ (e.g., 9−5=4) of the HW of the combined encoded word ($DQ1_n$ and $DQ2_m$) becomes much smaller than the range of variation ΔHWQ1, ΔHWQ2 (e.g., 8−0=8) of each individual code word, and SSN noise can be reduced further to 25% of the SSN of un-encoded transmission of the two words, whose Hamming Weight variation is shown in FIG. 7A.

Although FIGS. 3-6 illustrate the multiple word DBI encoding scheme with two 8-bit words, the multiple word DBI encoding scheme illustrated herein may be extended to any number of words, each word having any number of bits. For example, multiple word DBI encoding scheme described herein may be used to encode a 4-byte wide memory bus with each word corresponding to one byte, in which case SSN can be reduced to 6.25% of the SSN of un-encoded transmission of the 4 words (i.e., 50%×50%×50%×50%=6.25%) Thus, the multiple word DBI encoding scheme is not limited to the specific examples and methods described herein.

Upon reading this disclosure, those of ordinary skill in the art will appreciate still alternative structural and functional designs for DBI-encoding of multiple words of data to reduce SSO noise, through the disclosed principles of the present disclosure. Thus, while particular embodiments and applications of the present disclosure have been illustrated and described, it is to be understood that the disclosure is not limited to the precise construction and components disclosed herein. Various modifications, changes and variations which will be apparent to those skilled in the art may be made in the arrangement, operation and details of the method and apparatus of the present disclosure herein without departing from the spirit and scope of the disclosure as defined in the appended claims.

What is claimed is:

1. A circuit, comprising:
an encoder to receive first and second data words and to generate a first code word with a first data bus inversion (DBI) bit corresponding to the first data word and a second code word with a second DBI bit corresponding to the second data word, the first code word including a first plurality of data bits and the second code word including a second plurality of data bits; and
a transmitter configured to transmit in parallel the first and the second code words over a communication link,
wherein the encoder is configured to encode the first data word based at least in part on the Hamming Weight of the first data word and the Hamming Weight of the second data word such that a combined Hamming Weight related to the first and second code words is in a predetermined range.

2. The circuit of claim 1, wherein the combined Hamming Weight is the Hamming Weight of the first and second plurality of data bits.

3. The circuit of claim 1, wherein the combined Hamming Weight is the Hamming Weight of the first and second plurality of data bits and the first and second DBI bits.

4. The circuit of claim 1, wherein the first data word is one of a first set of data words and the second data word is one of a second set of data words, wherein the encoder is configured to generate first and second sequences of code words, the first sequence of code words corresponding to respective ones of the first set of data words and the second sequence of code words corresponding to respective ones of the second set of data words, wherein the first sequence of code words has a first range of Hamming Weight variation and the second sequence of code words has a second range Hamming Weight variation, and wherein the predetermined range has an associated Hamming Weight variation that is smaller than a sum of the first and second ranges of Hamming Weight variation.

5. The circuit of claim 1, wherein the encoder is further configured to invert or not invert the first data word based on a sum of the Hamming Weight of the first data word and the Hamming Weight of the second data word.

6. The circuit of claim 1, wherein the encoder is further configured to invert or not invert the first data word based on whether the Hamming Weight of the first data word is larger than the Hamming Weight of the second data word.

7. The circuit of claim 1, wherein:
both the first data word and the second data word are 8-bit words; and
the predetermined range has an associated Hamming Weight variation that is not greater than 4.

8. The circuit of claim 1, wherein the circuit is a memory controller configured to transmit the code words to a memory device over the communication link.

9. The circuit of claim 1, wherein the circuit is a memory device configured to transmit the first and second code words to a memory controller over the communication link.

10. An integrated circuit device, comprising:
a transmitter circuit for transmitting first and second sequences of code words in parallel over a communication link including first and second set of wires such that data bits in each code word in the first sequence of code words is carried by the first set of wires in parallel and data bits in each code word in the second sequence of code words is carried by the second set of wires in parallel, the first sequence of code words having a first range of Hamming Weight variation, and the second sequence of code words having a second range of Hamming Weight variation and;
an encoder circuit coupled to the transmitter circuit, the encoder configured to generate the first sequence of code words and the second sequence of code words such that a range of variation of a combined Hamming Weight of the data bits carried by both the first and second set of wires in parallel is smaller than a sum of the first range of Hamming Weight variation and the second range of Hamming Weight variation.

11. The integrated circuit device of claim 10, wherein the communication link further includes one or more first DBI wires and one or more second DBI wires, wherein the encoder circuit is further configured to generate first and second sequences of data bus inversion (DBI) bits corresponding to respective ones of the first and second sequences of code words over the DBI wires, and wherein the first and second sequences of code words are encoded such that a range of variation of a combined Hamming Weight of the data bits carried by the first and second set of wires and the first and second DBI wires in parallel is smaller than a sum of the first range of Hamming Weight variation and the second range of Hamming Weight variation.

12. The integrated circuit device of claim 10, wherein the range of variation of the combined Hamming Weight is not greater than 4.

13. The integrated circuit device of claim 10, wherein the integrated circuit device is a memory controller configured to transmit the code words to a memory device over the communication link.

14. The integrated circuit device of claim 10, wherein the integrated circuit device is a memory device configured to transmit the first and second sequence of code words to a memory controller over the communication link.

15. In a first circuit, a method of transmitting data to a second circuit over a parallel communication link, the method comprising:
receiving, at the first circuit, first and second data words and generating first and second code words corresponding to respective ones of the first and second data words, respectively, the first code word including a first plurality of data bits and the second code word including a second plurality of data bits; and
transmitting in parallel the first code word and the second code word from the first circuit to the second circuit over a communication link,
wherein the first and second code words are generated such that a combined Hamming Weight related to the first and second code words is in a predetermined range.

16. The method of claim 15, wherein the combined Hamming Weight is the sum of the Hamming Weights of the first and second code words.

17. The method of claim 15, further comprising generating first and second data bus inversion (DBI) bits corresponding to respective ones of the first and second code words, wherein the combined Hamming Weight is the Hamming Weight of the first and second plurality of data bits and their corresponding DBI bits.

18. The method of claim 15, wherein the first data word is one of a first set of data words and the second data word is one of a second set of data words, wherein the encoder is configured to generate first and second sequences of code words, the first sequence of code words corresponding to respective ones of the first set of data words and the second sequence of code words corresponding to respective ones of the second set of data words, wherein the first sequence of code words has a first range of Hamming Weight variation and the second sequence of code words has a second range Hamming Weight variation, and wherein the predetermined range has an associated Hamming Weight variation that is smaller than a sum of the first and second ranges of Hamming Weight variation.

19. The method of claim 15, wherein the first data word is inverted or not inverted based on a sum of the Hamming Weight of the first data word and the Hamming Weight of the second data word.

20. The method of claim 15, wherein the first data word is inverted or not inverted based on whether the Hamming Weight of the first data word is larger than the Hamming Weight of the second data word.

21. The method of claim 15, wherein:
both the first data word and the second data word are 8-bit words; and
the predetermined range has an associated Hamming Weight variation that is not greater than 4.

* * * * *